United States Patent
Vogas

(10) Patent No.: US 8,954,025 B2
(45) Date of Patent: Feb. 10, 2015

(54) TACTICAL RADIO TRANSCEIVER WITH INTERMEDIATE FREQUENCY (IF) FILTER PACKAGE FOR NARROWBAND AND WIDEBAND SIGNAL WAVEFORMS

(75) Inventor: Michael S. Vogas, Morristown, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 377 days.

(21) Appl. No.: 13/450,237

(22) Filed: Apr. 18, 2012

(65) Prior Publication Data

US 2012/0286893 A1      Nov. 15, 2012

Related U.S. Application Data

(60) Provisional application No. 61/483,992, filed on May 9, 2011.

(51) Int. Cl.
  *H04B 1/10* (2006.01)
  *H03H 9/05* (2006.01)
  *H04B 1/00* (2006.01)

(52) U.S. Cl.
  CPC ........... *H03H 9/0557* (2013.01); *H03H 9/0542* (2013.01); *H04B 1/006* (2013.01); *H03H 2240/00* (2013.01)
  USPC .............................. 455/307; 455/306; 455/304

(58) Field of Classification Search
  USPC .......................................... 455/303, 306, 307
  See application file for complete search history.

(56) References Cited

U.S. PATENT DOCUMENTS

| | | | | |
|---|---|---|---|---|
| 4,748,642 | A | * | 5/1988 | Bertsche ........................ 375/340 |
| 5,423,064 | A | * | 6/1995 | Sakata ........................... 455/437 |
| 5,561,406 | A | * | 10/1996 | Ikata et al. ..................... 333/126 |
| 6,229,991 | B1 | * | 5/2001 | Hietala et al. ................... 455/75 |
| 6,256,511 | B1 | * | 7/2001 | Brown et al. ............... 455/552.1 |
| 6,985,715 | B2 | * | 1/2006 | Lee ................................ 455/402 |
| 7,408,898 | B1 | * | 8/2008 | Brown ........................... 370/328 |
| 7,460,851 | B2 | | 12/2008 | Chiu et al. |
| 7,746,763 | B2 | * | 6/2010 | Fruhauf et al. ................ 370/208 |
| 7,983,627 | B2 | * | 7/2011 | Adler et al. ...................... 455/83 |
| 8,265,585 | B2 | * | 9/2012 | Inako et al. .................... 455/307 |
| 8,463,199 | B2 | * | 6/2013 | Sugar et al. ..................... 455/73 |
| 8,611,843 | B2 | | 12/2013 | Vogas |
| 8,761,704 | B2 | * | 6/2014 | Mochizuki ..................... 455/266 |
| 2003/0025580 | A1 | * | 2/2003 | Wheeler et al. ................. 335/78 |
| 2006/0114969 | A1 | | 6/2006 | Ahn et al. |
| 2006/0270374 | A1 | * | 11/2006 | Lester et al. ................... 455/307 |
| 2007/0002898 | A1 | * | 1/2007 | Boariu et al. .................. 370/468 |

(Continued)

*Primary Examiner* — Andrew Wendell
*Assistant Examiner* — Cindy Trandai
(74) *Attorney, Agent, or Firm* — Leo Zucker; Daniel J. Long

(57) ABSTRACT

A communications radio has an IF stage with an associated filter array. The array includes at least one narrowband filter whose passband is less than 3 MHz, at least one wideband filter whose passband is 3 MHz or greater, a first switch with a common pole connected to an input terminal of the array, a second switch with a common pole connected to an output terminal of the array, a third switch whose common pole is operatively connected to the input terminal, and a fourth switch whose common pole is operatively connected to the output terminal. The first and the second switches cooperate to insert a selected filter between the first and second terminals. The third and the fourth switches cooperate to insert the filter array into either a receive signal path when the radio is in a receive mode, or a transmit signal path when in a transmit mode.

19 Claims, 7 Drawing Sheets

(56) References Cited

U.S. PATENT DOCUMENTS

| | | | |
|---|---|---|---|
| 2007/0243839 A1* | 10/2007 | Kostic | 455/132 |
| 2009/0065929 A1* | 3/2009 | Hiranuma et al. | 257/724 |
| 2009/0088124 A1* | 4/2009 | Schuur et al. | 455/341 |
| 2011/0116490 A1* | 5/2011 | Wilhelmsson et al. | 370/343 |
| 2012/0250564 A1* | 10/2012 | Marque-Pucheu et al. | 370/252 |
| 2012/0287585 A1 | 11/2012 | Vogas et al. | |
| 2012/0289171 A1 | 11/2012 | Vogas | |
| 2012/0289174 A1 | 11/2012 | Horihan et al. | |

* cited by examiner

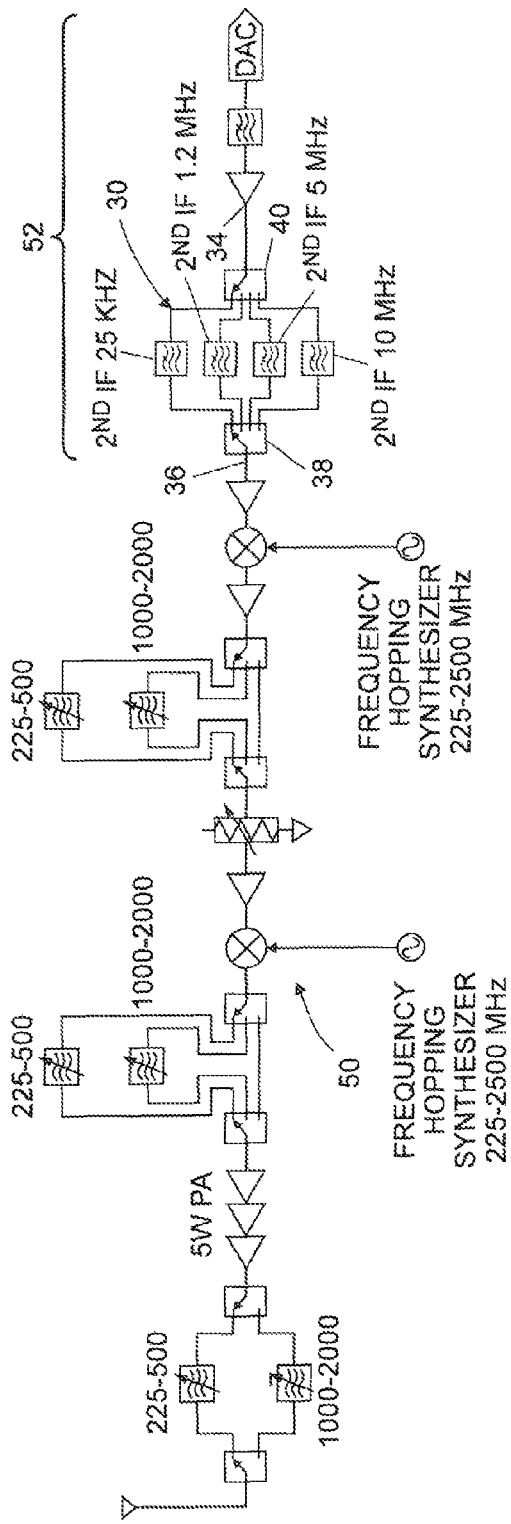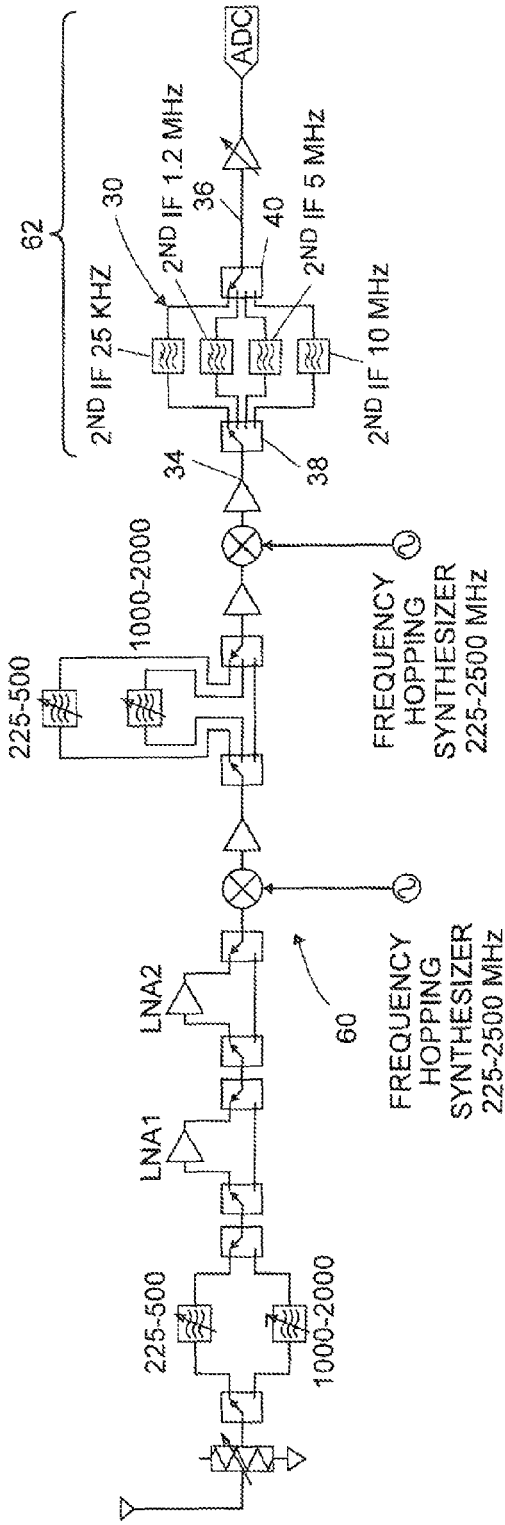
FIG. 3A
FIG. 3B

TACTICAL RADIO TRANSCEIVER WITH INTERMEDIATE FREQUENCY (IF) FILTER PACKAGE FOR NARROWBAND AND WIDEBAND SIGNAL WAVEFORMS

CROSS REFERENCE TO RELATED APPLICATION

The present application claims priority under 35 U.S.C. Sec. 119(e) of U.S. Provisional Patent Application No. 61/483,992 filed May 9, 2011, titled "Adaptable IF for Narrowband and Wideband Waveform Operation", and incorporated by reference in its entirety.

BACKGROUND OF THE INVENTION

1. Field of the Invention

The present invention relates generally to radio communications, and particularly to a communications radio for use with multiple narrowband and wideband signal waveforms.

2. Discussion of the Known Art

Radio frequency (RF) transmitters and receivers for the Joint Tactical Radio System (JTRS) typically have bandpass filters arranged in intermediate frequency (IF) stages of the communications equipment to support the reception and transmission of signal waveforms defined by the JTRS. The waveforms are referred to as being either "narrowband" or "wideband" depending on the bandwidth needed to pass them through various stages of the equipment without distortion. Waveforms whose bandwidths are less than 3 MHz wide are generally considered narrowband, and waveforms with bandwidths of 3 MHz or greater are referred to as wideband. Typical uses and bandwidth requirements for several JTRS signal waveforms including WNW, SRW, NCW, HNW, and MUOS are disclosed in T. Mann, JTRS/WIN-T: Networking Waveform Quick Reference Sheets, on the Web at findarticles.com/p/articles/ (Summer 2008), which is incorporated by reference. See also, IT Mentor Group, Inc., Joint Tactical Radio System, on the Web at itmentor.com/jtrs.htm; and Joint Tactical Radio System, at en.wikipedia.org/wiki/JTRS.

Under the JTRS, one GMR communications platform may operate on up to four frequency channels, wherein each channel carries one of the JTRS waveforms (e.g., EPLRS, SINCGARS, HF ISB/SSB/ALE, SRW, WNW, or UHF DAMA SATCOM). See, P. H. Sniffen, Joint Tactical Radio System: AMF, GMR, HMS, on the Web at low-powerwireless.com/blog/designarticles/ (March 2012), which is incorporated by reference.

U.S. Pat. Pub. 2006/0114969 (Jun. 1, 2006) describes a data transmission device including an array of four surface acoustic wave (SAW) filters the inputs of which are switched selectively to receive a pulse signal, and the outputs of which are combined to produce analog signals having different frequency characteristics. U.S. Pat. No. 7,460,851 (Dec. 2, 2008) discloses a device for integrating a single SAW filter and a transceiver by encapsulating them to form an integrated chip. Neither patent document suggests a filter array that supports multiple narrowband and wideband waveform operation in radio equipment, however.

Small form factors specified by the military for tactical vehicular radios, as well as cost considerations, tend to limit the number of filters that can be provided with associated switches and discrete matching elements (resistors, inductors, and capacitors) inside one radio. For example, as shown in FIG. 1, an IF signal stage of a radio developed by BAE Systems includes a switched bank or array 10 of two SAW bandpass filters 12, 14, for enabling the bandwidth of the stage to be set to either 0.5 MHz or 1.2 MHz. The filters 12, 14, switches 16, 18, and discrete elements for matching the filters electrically with the IF stage, are arrayed individually over an area of defined length and width on the surface of a circuit board 20. The dimensions of the radio are within the form factors specified by the JTRS for Ground Mobile Radio (GMR), but it supports only a small subset of the various JTRS waveforms. Therefore, there is a need for a compact filter array or package that allows a radio to operate with multiple narrowband and wideband signal waveforms, without exceeding the physical dimensions of present narrowband waveform filter arrays.

SUMMARY OF INVENTION

According to the present invention, a communications radio includes an intermediate frequency (IF) stage, and a filter array for the IF stage including at least one narrowband filter having a passband of less than 3 MHz, at least one wideband filter having a passband of 3 MHz or greater, a first switch having a common pole coupled to an input terminal, and a second switch having a common pole coupled to an output terminal.

The first and the second switches are arranged to cooperate to insert a selected one of the filters between the input and the output terminals. The common pole of the first switch is arranged to connect the filter array into a selected one of (i) a receive signal path through the IF stage when the radio is in a receive mode of operation, and (ii) a transmit signal path through the IF stage when the radio is in a transmit mode of operation.

For a better understanding of the invention, reference is made to the following description taken in conjunction with the accompanying drawing and the appended claims.

BRIEF DESCRIPTION OF THE DRAWING

In the drawing:

FIG. 3A is a schematic diagram of RF and IF stages of a communications transmitter including the inventive filter array;

FIG. 3B is a schematic diagram of RF and IF stages of a communications receiver including the inventive filter array;

DETAILED DESCRIPTION OF THE INVENTION

Figure 2:
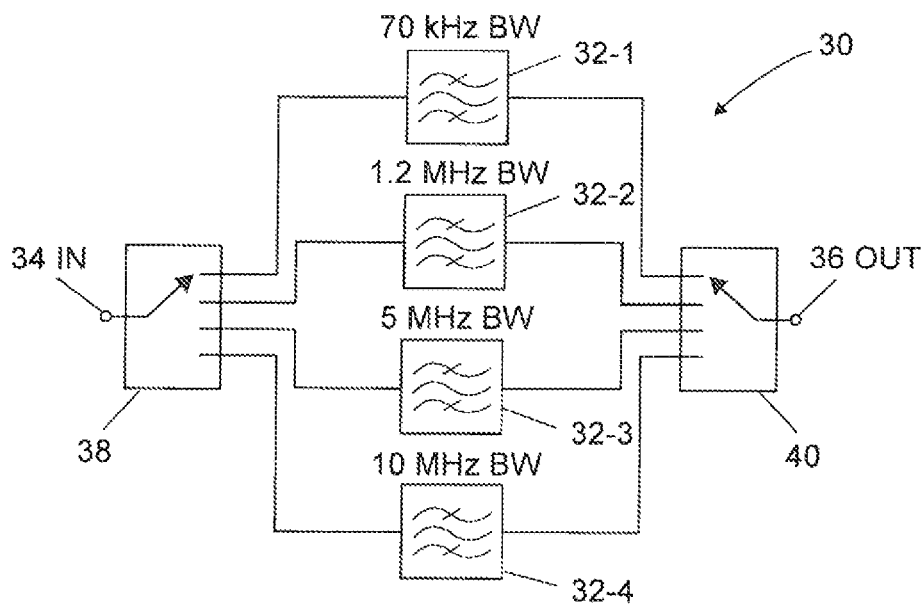
FIG. 2 is a block diagram of a communications filter array according to the invention, on the circuit board of FIG. 1.

FIG. 2 shows a first embodiment of a communications filter array 30 according to the invention. In the disclosed embodiment, the filter array 30 includes four IF bandpass filters 32-1, 32-2, 32-3 and 32-4 that are selected individually and connected between an array input terminal 34 and an array output terminal 36 by operation of first and second switches 38, 40 whose common poles connect to the input and the output terminals 34, 36, as shown. The array 30 allows for the production of a tactical radio that is compatible with all the physical, electrical, and software requirements of a GMR radio. To enable operation with multiple JTRS narrowband and wideband signal waveforms, the filters 32-1 to 32-4 are valued at, for example, 70 kHz, 1.2 MHz, 5 MHz, and 10 MHz, all centered about a nominal IF of, e.g., 70 MHz.

The filters 32-1 to 32-4 are preferably SAW filters and are commercially available from Sawtek or TeleFilter GmbH in die form as flat rectangular ceramic packages with terminals exposed at spaced intervals about the perimeter of each package. The switches 36, 38, are also available in die form from Skyworks Solutions.

FIG. 3A is a schematic diagram of RF and IF stages of a communications transmitter 50 including the filter array 30 provided in an IF stage 52, and FIG. 3B is a schematic diagram of RF and IF stages of a communications receiver 60 including the filter array 30 in an IF stage 62. In both the transmitter 50 and the receiver 60, the filter array 30 includes the two narrowband filters 32-1, 32-2 and the two wideband filters 32-3, 32-4 shown in FIG. 2. It will be understood, however, that more or fewer filters may be provided in each array 30, preferably so that array 30 has at least one narrowband and at least one wideband filter.

Figure 4:
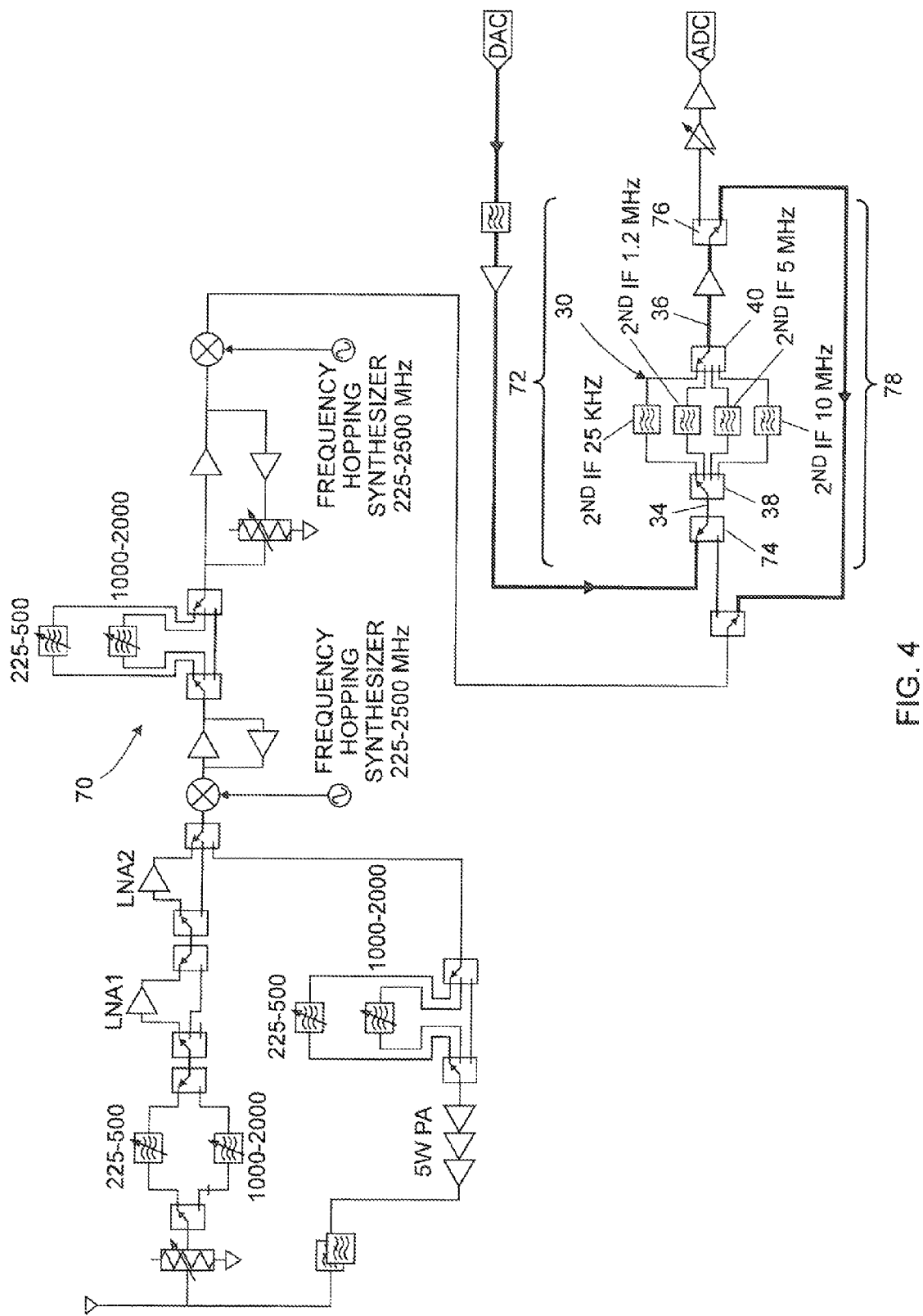
FIG. 4 is a schematic diagram of RF and IF stages of a communications transceiver including the inventive filter array, in a transmit mode of operation.
Figure 5:
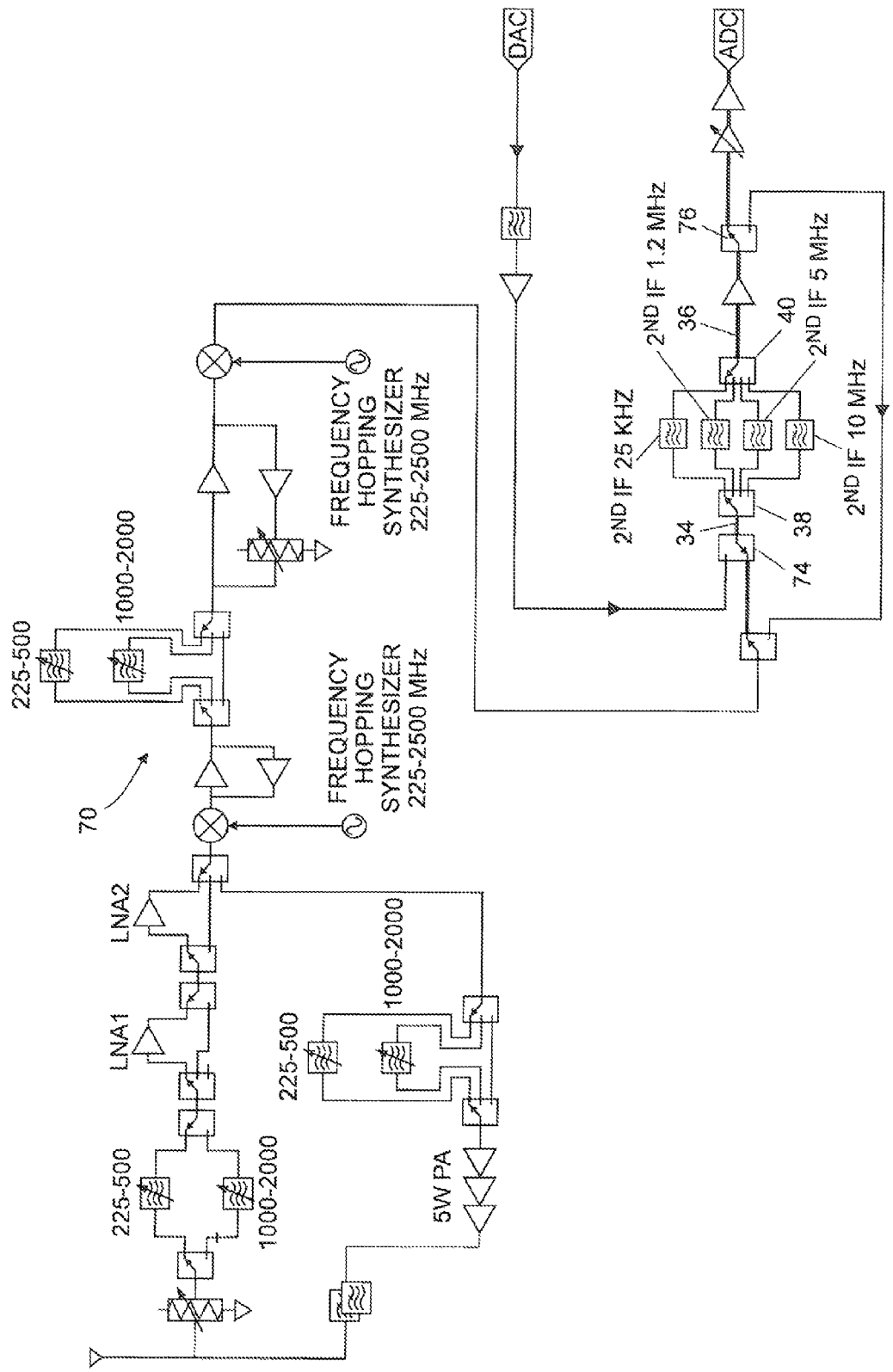
FIG. 5 is a schematic diagram of the RF and IF stages of the transceiver in FIG. 4, in a receive mode of operation.

FIGS. 4 and 5 show a schematic diagram of RF and IF stages of a combined communications transmitter and receiver (transceiver) 70. The transceiver 70 is configured so that a single filter array 30 is operative in an IF stage 72 of the transceiver when the transceiver is in either a transmit or a receive mode of operation. The darkened lines in FIG. 4 are signal paths that are active when the transceiver 70 is in the transmit mode, and the darkened lines in FIG. 5 are signal paths that are active when the transceiver is in the receive mode. A third switch 74 has a common pole operatively connected to the input terminal 34 of the array 30, and a fourth switch 76 has a common pole operatively connected to the array output terminal 36 as shown in FIGS. 4 and 5. The first and the second switches 38, 40 cooperate to insert a selected filter between the first and the second terminals 34, 36. The third and the fourth switches 74, 76 cooperate to insert the entire filter array 30 into either a receive signal path when the radio is in a receive mode, or a transmit signal path when in a transmit mode.

In the illustrated transceiver 70, the filter array 30 includes the two narrowband filters 32-1, 32-2 and the two wideband filters 32-3, 32-4 shown in FIG. 2. It will be understood, however, that more or fewer filters may be provided in the one array 30, preferably so that array has at least one narrowband and at least one wideband filter.

Figure 6:
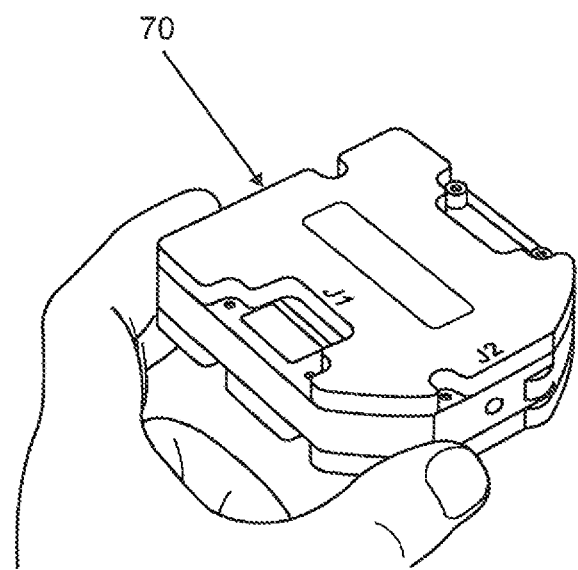
FIG. 6 is an external view of the entire communications transceiver.
Figure 7:
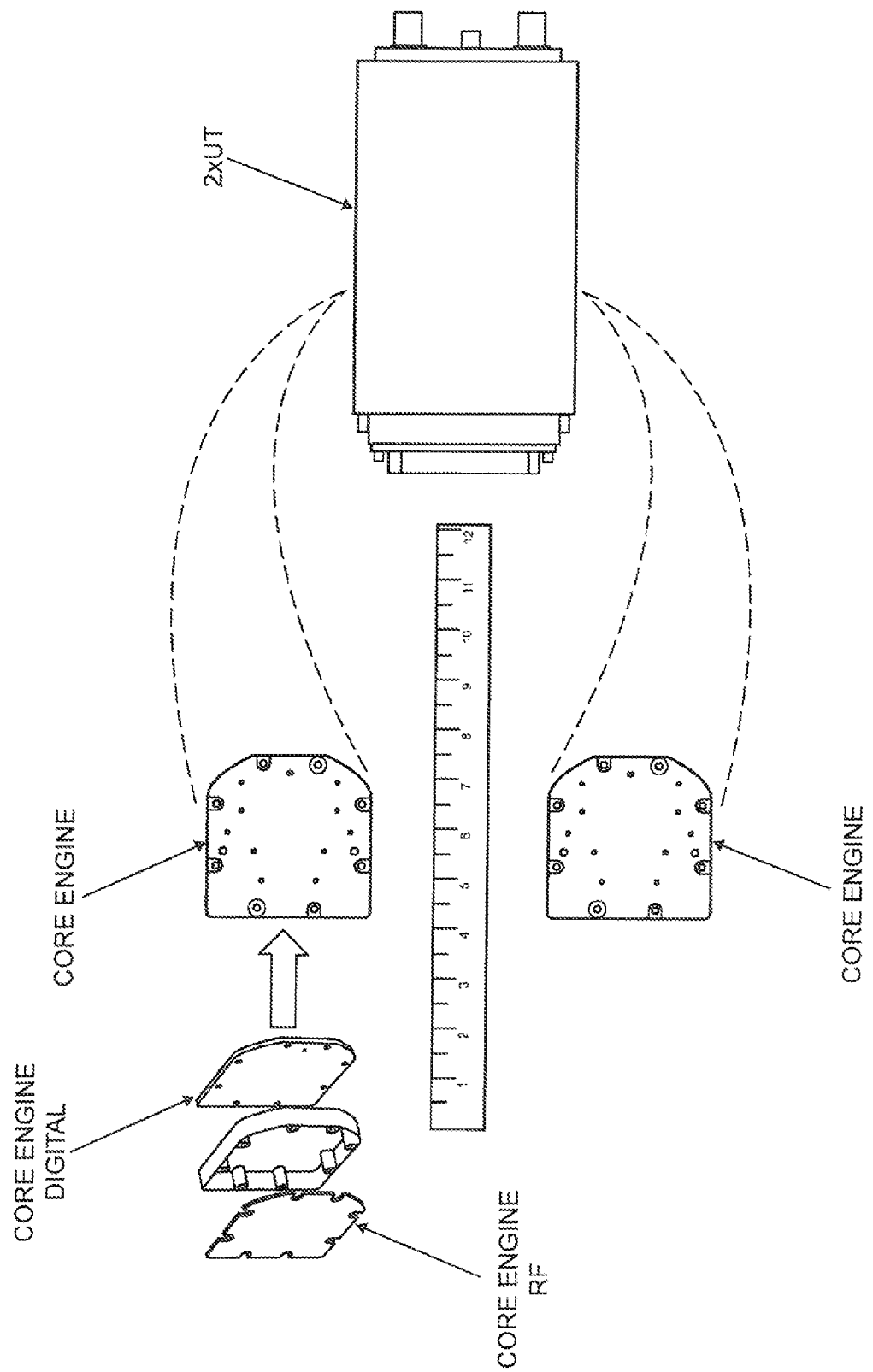
FIG. 7 illustrates an assembly of two of the transceivers to form a dual integrated core engine.

FIG. 6 is an external view showing the relative size of the entire transceiver 70. In FIG. 7, two transceivers 70 each configured with a single IF filter array 30, are assembled to form a dual integrated core engine (DICE) that may be mounted inside a dual channel transceiver (DCT) measuring only about 4 in. high by 7.5 in. deep by 2.4 in. wide, weighing less than four pounds, and consuming not more than about 52 watts of power.

In addition to multiple narrowband and wideband JTRS waveforms now used in GMR, HMS, AMF, and MIDS programs, and by selecting corresponding values for the bandpass filters in the array 30, the transceiver 70 can be used for applications beyond JTRS, for example, SIGINT, RF MASINT, test equipment, and high-band data links like CDL, whose waveforms are transmitted over a wide RF spectrum ranging from 30 MHz to 6 GHz. Important narrowband waveforms allocated for use in the VHF radio spectrum and not currently supported by existing GMR radios can also be supported by the filter array 30. By using a system-in-package implementation that integrates the array filters, the switches 38, 40 and filter matching elements in die form as described below, the capability of the transceiver 70 may be extended further to support signal waveforms having bandwidths as wide as 30 and 40 MHz.

Figure 8:
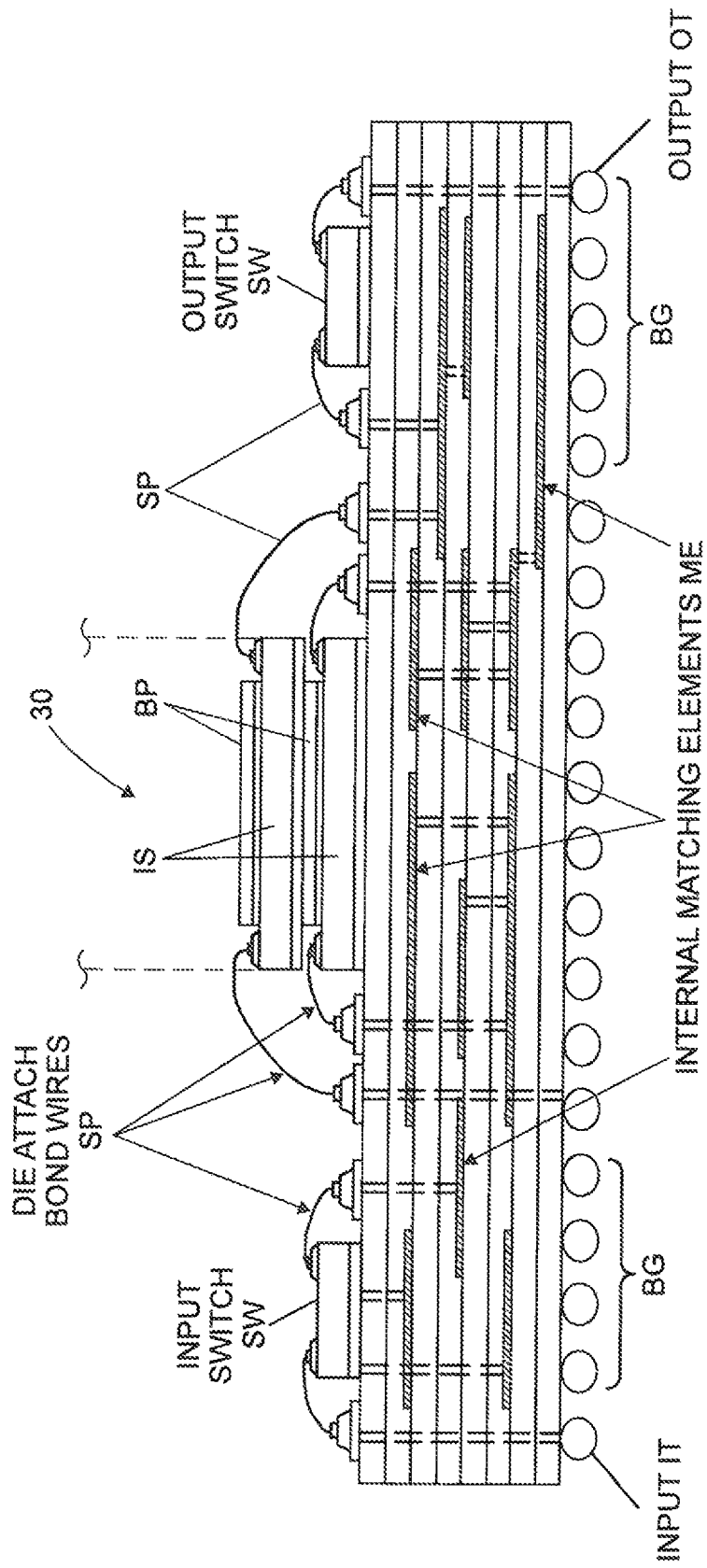
FIG. 8 illustrates an assembly of components of the inventive filter array in the form of a compact filter package.

FIG. 8 illustrates an assembly of the filter array 30 wherein components are stacked to form a compact package. As shown in the drawing, the dies of each bandpass filter BP are aligned and stacked one over the other in a determined order, with an insulating substrate IS sandwiched between adjacent ones of the filters. Matching elements ME for each of the filters are preferably embedded in one or more substrates in LTCC form that are supported in a region between a lowermost filter substrate carrier, and a ball grid array BG provided at the bottom of the stack for connecting the package with corresponding terminals on a circuit board. The array input and output switches SW are mounted atop the uppermost substrate in which the matching elements ME are embedded, as shown.

Signal paths SP for connecting terminals of each of the filter package components to their corresponding embedded matching elements ME are formed with bond wires. An input terminal IT is provided on the package, and the terminal IT connects to a common terminal of input switch SW to establish a connection between the input of a selected filter and the input terminal. An output terminal OT on the package connects to a common terminal of the output switch SW to make a connection between the output of the selected filter and the output terminal of the array.

Figure 1:
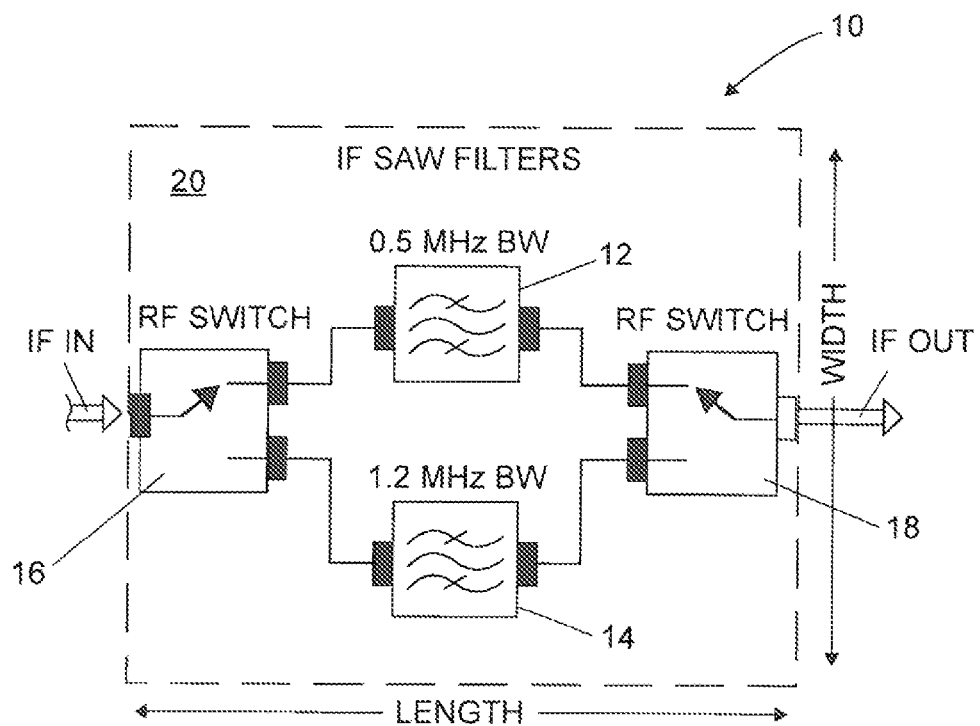
FIG. 1 is a block diagram of a prior communications filter array occupying a defined area on a circuit board.

It will be appreciated that when the filter array 30 is provided in the stacked form of FIG. 8, it can be mounted within the same area on the circuit board 20 as the two filters 12, 14 in FIG. 2, and with a substantially smaller footprint. By aligning and stacking the components of the array 30, the degree of functionality integrated over a given area of the circuit board 20 is substantially increased. In addition, high speed electrical performance of the components is enhanced by connecting the stacked filters BP, switches SW, and matching elements ME to one another using relatively short signal paths. That is, parasitic inductance and capacitance produced by longer signal paths needed to connect individually mounted filters, switches, and matching elements at different locations on a circuit board as in FIGS. 1 and 2, are reduced substantially in the stacked filter array 30.

As disclosed herein, with the filter array 30, a communications radio or transceiver can support multiple JTRS and other narrowband and wideband waveforms in a tactical environment over a wide RF spectrum, while maintaining a relatively small form factor.

While the foregoing represents preferred embodiments of the present invention, it will be understood by persons skilled in the art that various modifications, additions, and changes can be made without departing from the spirit and scope of the invention, and that the invention includes all such modifications and changes that are within the scope of the appended claims.

I claim:

1. A communications radio of transceiver, comprising:
   at least one circuit board;
   a radio frequency (RF) stage configured for receiving and transmitting certain communications signal waveforms over a given RF channel;
   an intermediate frequency (IF) stage coupled to the RF stage for handling the signal waveforms as centered about a certain nominal IF frequency;

a filter array mounted on a circuit board for filtering the signal waveforms in the IF stage of the transceiver, the filter array including, an array input terminal and an array output terminal;

one or more narrowband IF filters each having a passband of less than 3 MHZ;

one or more wideband IF filters each having a passband of 3 MHZ or greater;

a first switch having a common pole connected to the array input terminal, and a second switch having a common pole connected to the array output terminal;

the first and the second switches are arranged to cooperate to connect a selected one of the narrowband and the wideband IF filters between the array input terminal and the array output terminal;

a third switch having a common pole operatively connected to the array input terminal, and a fourth switch having a common pole operatively connected to the array output terminal;

wherein the third and the fourth switches are arranged to cooperate with one another to insert the selected one of the narrowband and wideband IF filters connected between the array input and output terminals, into (i) a receive signal path in the IF stage when the transceiver is in a receive mode of operation, and (ii) a transmit signal path in the IF stage when the transceiver is in a transmit mode of operation;

the IF filters, the matching elements, and the first and the second switches of the filter array are aligned and stacked one over the other to form a filter package; and a ball grid array fixed on a bottom end of the filter package, for operatively connecting components of the package with corresponding terminals on the circuit board.

2. A radio transceiver according to claim 1, wherein one or more of the narrowband and the wideband IF filters of the filter array are surface acoustic wave (SAW) filters.

3. A radio transceiver according to claim 1, wherein one or more of the narrowband and the wideband IF filters of the filter array have passbands that correspond to bandwidths of waveforms defined by the Joint Tactical Radio System (JTRS).

4. A radio transceiver according to claim 1, wherein the filter array includes four IF filters having passbands of approximately 70 kHz, 1.2 MHZ, 5 MHZ, and 10 MHZ.

5. A radio transceiver according to claim 1, wherein the filter array includes a wideband IF filter having a passband of about 30 MHZ.

6. A radio transceiver according to claim 1, wherein the filter array includes a wideband IF filter having a passband of about 40 MHZ.

7. A radio transceiver according to claim 1, wherein the IF stage has a nominal frequency of approximately 70 MHZ.

8. A radio transceiver according to claim 1, including a radio frequency (RF) circuit board and a digital circuit board.

9. A dual channel, tactical communications radio transceiver, comprising:

first and second core engines, wherein each one of the first and the second core engines includes:

at least one circuit board;

a radio frequency (RF) stage configured for receiving and transmitting certain communications signal waveforms over a given RF channel;

an intermediate frequency (IF) stage coupled to the RF stage for handling the signal waveforms as centered about a certain nominal IF frequency;

a filter array mounted on a circuit board for filtering the signal waveforms in the IF stage of the transceiver, wherein the filter array includes, an array input terminal and an array output terminal;

one or more narrowband IF filters each having a passband of less than 3 MHZ;

one or more wideband IF filters each having a passband of 3 MHZ or greater;

a first switch having a common pole connected to the array input terminal, and a second switch having a common pole connected to the array output terminal;

the first and the second switches are arranged to cooperate to connect a selected one of the narrowband and the wideband IF filters between the array input and output terminals;

a third switch having a common pole operatively connected to the array input terminal, and a fourth switch having a common pole operatively connected to the array output terminal;

wherein the third and the fourth switches are arranged to cooperate with one another to insert the selected one of the narrowband and wideband IF filters connected between the array input and output terminals, into (i) a receive signal path in the IF stage when the core engine is in a receive mode of operation, and (ii) a transmit signal path in the IF stage when the core engine is in a transmit mode of operation;

the IF filters, the matching elements, and the first and the second switches of the filter array are aligned and stacked one over the other to form a filter package; and a ball grid array fixed on a bottom end of the filter package, for operatively connecting components of the filter package with corresponding terminals on the circuit board.

10. A dual channel transceiver according to claim 9, wherein the transceiver measures approximately 4 inches by 7.5 inches by 2.4 inches.

11. A dual channel transceiver according to claim 9, wherein the transceiver weighs less than four pounds.

12. A dual channel transceiver according to claim 9, wherein the transceiver consumes not more than about 52 watts of power.

13. A dual channel transceiver according to claim 9, wherein one or more of the narrowband and the wideband IF filters of the filter array are surface acoustic wave (SAW) filters.

14. A dual channel transceiver according to claim 9, wherein one or more of the narrowband and the wideband IF filters of the filter array have passbands that correspond to bandwidths of waveforms defined by the Joint Tactical Radio System (JTRS).

15. A dual channel transceiver according to claim 9, wherein the filter array includes four IF filters having passbands of approximately 70 kHz, 1.2 MHZ, 5 MHZ, and 10 MHZ.

16. A dual channel transceiver according to claim 9, wherein the filter array includes a wideband IF filter having a passband of about 30 MHZ.

17. A dual channel transceiver according to claim 9, wherein the filter array includes a wideband IF filter having a passband of about 40 MHZ.

18. A dual channel transceiver according to claim 9, wherein the IF stage has a nominal frequency of approximately 70 MHZ.

19. A dual channel transceiver according to claim 9, wherein each one of the first and the second core engines includes a radio frequency (RF) circuit board and a digital circuit board.

* * * * *